United States Patent
Tamai et al.

(10) Patent No.: US 11,066,509 B2
(45) Date of Patent: Jul. 20, 2021

(54) CONDUCTIVE PASTE COMPOSITION, DEVICE COMPRISING ELECTRODE FORMED FROM SAME, AND METHOD FOR PRODUCING CONDUCTIVE PASTE COMPOSITION

(71) Applicant: KANEKA CORPORATION, Osaka (JP)

(72) Inventors: Hitoshi Tamai, Osaka (JP); Masanori Kanematsu, Osaka (JP); Daisuke Adachi, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/695,750

(22) Filed: Nov. 26, 2019

(65) Prior Publication Data
US 2020/0095370 A1 Mar. 26, 2020

Related U.S. Application Data

(63) Continuation of application No. PCT/JP2018/020237, filed on May 25, 2018.

(30) Foreign Application Priority Data

May 26, 2017 (JP) .............................. JP2017-104179

(51) Int. Cl.
| | |
|---|---|
| *C08G 59/22* | (2006.01) |
| *C08K 3/00* | (2018.01) |
| *C08K 3/08* | (2006.01) |
| *C08K 5/00* | (2006.01) |
| *C08K 5/09* | (2006.01) |
| *C08K 5/1539* | (2006.01) |
| *C08K 5/3445* | (2006.01) |
| *C08L 83/06* | (2006.01) |
| *H01B 1/22* | (2006.01) |
| *C08K 3/013* | (2018.01) |

(52) U.S. Cl.
CPC ............ *C08G 59/223* (2013.01); *C08K 3/013* (2018.01); *C08K 3/08* (2013.01); *C08K 5/0025* (2013.01); *C08K 5/09* (2013.01); *C08K 5/1539* (2013.01); *C08K 5/3445* (2013.01); *C08L 83/06* (2013.01); *H01B 1/22* (2013.01); *C08K 2003/085* (2013.01); *C08K 2003/0806* (2013.01); *C08K 2003/0812* (2013.01); *C08K 2003/0862* (2013.01); *C08K 2201/001* (2013.01); *C08K 2201/005* (2013.01); *C08K 2201/006* (2013.01); *C08L 2203/202* (2013.01); *C08L 2203/204* (2013.01); *C08L 2203/206* (2013.01)

(58) Field of Classification Search
USPC ......................................... 524/439, 860, 863
See application file for complete search history.

(56) References Cited

FOREIGN PATENT DOCUMENTS

| | | |
|---|---|---|
| CN | 101506321 A | 8/2009 |
| JP | H07161740 A | 6/1995 |
| JP | H08176409 A | 7/1996 |
| JP | H09176607 A | 7/1997 |
| JP | H11213756 A | 8/1999 |
| JP | H11286630 A | 10/1999 |
| JP | 2004221006 A | 8/2004 |
| JP | 2014088466 A | 5/2014 |
| JP | 2015111576 A | 6/2015 |

OTHER PUBLICATIONS

Office Action issued in Chinese Application No. 201880033348.7, dated Jul. 3, 2020 (12 pages).
International Search Report issued in corresponding International Application No. PCT/JP2018/020237; dated Aug. 21, 2018 (1 page).
Written Opinion of the International Searching Authority issued in corresponding International Application No. PCT/JP2018/020237; dated Aug. 21, 2018 (4 pages).

*Primary Examiner* — Fred M Teskin
(74) *Attorney, Agent, or Firm* — Osha Bergman Watanabe & Burton LLP

(57) ABSTRACT

A conductive paste composition includes 1 to 10 parts by weight of a binder (A), 2 to 20 parts by weight of an epoxy monomer (B), 1 to 20 parts by weight of a crosslinking agent (C), and 70 to 95 parts by weight of a conductive filler (D). The binder (A) is a reactive oligomer having a siloxane bond as a main skeleton and including a plurality of oxirane rings as an organic group. The epoxy monomer (B) includes an oxirane ring. The total amount of the binder (A), the epoxy monomer (B), the crosslinking agent (C), and the conductive filler (D) is 100 parts by weight.

8 Claims, No Drawings

CONDUCTIVE PASTE COMPOSITION, DEVICE COMPRISING ELECTRODE FORMED FROM SAME, AND METHOD FOR PRODUCING CONDUCTIVE PASTE COMPOSITION

TECHNICAL FIELD

One or more embodiments of the present invention relate to a conductive paste composition, a device including an electrode formed from the same, and a method for producing the conductive paste composition.

BACKGROUND

Conductive paste compositions have recently been used for wires in FPCs (Flexible Printed Circuits) to be mounted on flat panel displays (FPDs) of smartphones, tablets, flat-screen televisions and car navigation systems, and the like, or for collecting electrodes of solar cells.

Typical conductive paste compositions are printed on an object (for instance, a silicon substrate of a solar cell) and then dried, cured and fired, but the conductive paste compositions shrink during curing and have internal stress even after firing. Such shrinkage or internal stress causes not only deformation or breakage of the wiring and/or the electrode itself, but also deformation or breakage of the object.

In order to inhibit these problems, for example, Patent Document 1 employs rubber as a binder in the conductive paste composition. In Patent Document 2, rubber particles are added to the binder.

Patent Document 1: Japanese Unexamined Patent Application, Publication No. 2004-221006
Patent Document 2: Japanese Unexamined Patent Application, Publication No. 2015-111576

However, viscosities of the conductive paste compositions of both the documents are high, because the rubber components are polymers. Therefore, fine printing cannot be performed. In order to solve this problem, reducing the content of the conductive filler in the conductive paste composition has been considered. Such reduction, however, increases the resistance of the electrode.

SUMMARY

One or more embodiments of the present invention provide a conductive paste composition or the like which is electrically low in resistance, does not cause excessive shrinkage in the electrode formation process, and can suppress internal stress when the electrode is completed.

The inventors have made extensive studies in order to solve the above-mentioned problems, and as a result, one or more embodiments of the present invention have been completed. More specifically, one or more embodiments of the present invention provide the following.

A first aspect according to one or more embodiments of the present invention is a conductive paste composition comprising at least a binder (A), an epoxy monomer (B), a crosslinking agent (C) and a conductive filler (D), in which the binder (A) is a reactive oligomer having a siloxane bond as a main skeleton and comprising a plurality of oxirane rings as an organic group,
the epoxy monomer (B) comprises an oxirane ring, and the conductive paste composition comprises the binder (A) in an amount of 1 part by weight or more and 10 parts by weight or less, the epoxy monomer (B) in an amount of 2 parts by weight or more and 20 parts by weight or less, the crosslinking agent (C) in an amount of 1 part by weight or more and 20 parts by weight or less and the conductive filler (D) in an amount of 70 parts by weight or more and 95 parts by weight or less, with regard to 100 parts by weight of the total of (A) to (D).

A second aspect according to one or more embodiments of the present invention is the conductive paste composition according to the first aspect, in which the epoxy monomer (B) comprises at least one selected from the group consisting of a bifunctional monomer having a glycol structure and a monofunctional monomer having an aliphatic structure.

A third aspect according to one or more embodiments of the present invention is the conductive paste composition according to the first aspect or the second aspect, in which the crosslinking agent (C) is a compound having a heat latent property.

A fourth aspect according to one or more embodiments of the present invention is the conductive paste composition according to any one of the first aspect to the third aspect, in which the crosslinking agent (C) contains at least one selected from the group consisting of an imidazole compound, a hydrazine compound and an acid anhydride.

A fifth aspect according to one or more embodiments of the present invention is the conductive paste composition according to any one of the first aspect to the fourth aspect, further comprising a dehydrating agent (E).

A sixth aspect according to one or more embodiments of the present invention is the conductive paste composition according to the fifth aspect, in which the dehydrating agent (E) is an acid anhydride.

A seventh aspect according to one or more embodiments of the invention is a device comprising an electrode formed from the conductive paste composition according to any one of the first aspect to the sixth aspect.

An eighth aspect according to one or more embodiments of the invention is a method for producing a conductive paste composition, the conductive paste composition comprising at least a binder (A), an epoxy monomer (B), a crosslinking agent (C), a conductive filler (D) and a dehydrating agent (E), in which
the binder (A) is a reactive oligomer having a siloxane bond as a main skeleton and comprising a plurality of oxirane rings as an organic group,
the epoxy monomer (B) comprises an oxirane ring, and the conductive paste composition comprises the binder (A) in an amount of 1 part by weight or more and 10 parts by weight or less, the epoxy monomer (B) in an amount of 2 parts by weight or more and 20 parts by weight or less, the crosslinking agent (C) in an amount of 1 part by weight or more and 20 parts by weight or less, and the conductive filler (D) in an amount of 70 parts by weight or more and 95 parts by weight or less, with regard to 100 parts by weight of the total of (A) to (D);
the method comprising
adding the dehydrating agent (E) to the binder (A) before adding any one of (B) to (D) to the binder (A) or
adding the dehydrating agent (E) to the conductive filler (D), and then further adding (A) to (C).

The conductive paste composition according to one or more embodiments of the present invention is electrically low in resistance, does not cause excessive shrinkage in the electrode formation process, and suppresses internal stress when the electrode is completed.

DETAILED DESCRIPTION OF EMBODIMENTS

One or more embodiments of the present invention are described below, but the present invention is not limited thereto.

[Conductive Paste Composition]

The conductive paste composition comprises at least a binder (A), an epoxy monomer (B), a crosslinking agent (C) and a conductive filler (D). The binder (A) is a reactive oligomer having a siloxane bond as a main skeleton and comprising a plurality of oxirane rings as an organic group. The epoxy monomer (B) comprises an oxirane ring. Additionally, with regard to 100 parts by weight of the total of the binder (A), the epoxy monomer (B), the crosslinking agent (C) and the conductive filler (D), the conductive paste composition comprises the binder (A) in an amount of 1 part by weight or more and 10 parts by weight or less, the epoxy monomer (B) in an amount of 2 parts by weight or more and 20 parts by weight or less, the crosslinking agent (C) in an amount of 1 part by weight or more and 20 parts by weight or less, and the conductive filler (D) in an amount of 70 parts by weight or more and 95 parts by weight or less.

Such a conductive paste composition is used as a wiring material or an electrode material in devices such as an FPD or a solar cell. Note that in this specification, a wiring or an electrode is referred to as an "electrode" for convenience.

Generally, it is necessary for the conductive paste composition to contain a large amount of conductive filler to ensure decreased electrical resistance, which is a function as an electrode material, (in one or more embodiments of the present invention, 70 parts by weight or more of conductive filler are required as described above). Under such a condition, if a conductive paste composition is designed by adding a common binder and a crosslinking agent to a conductive filler, the conductive paste composition has high viscosity, which makes it difficult to obtain viscosity applicable for fine printing.

In such a case, addition of a diluent is considered for viscosity adjustment. However, use of, for example, a common high boiling point solvent as the diluent makes the electrode thinner than a desired size or warped, when the conductive paste composition is fabricated into an electrode (circuit) through drying and firing, which volatilizes the diluent and results in volume shrinkage.

In order to prevent this volume shrinkage, addition of a reactive diluent (a monomer) can be considered. However, for example, when a reactive diluent having a large number of functional groups in the molecule or a reactive diluent having a small molecular weight is used, curing shrinkage occurs due to reaction by the reactive diluent itself, and low shrinkage characteristics of a typical binder (bisphenol A-based epoxy resin or the like) are offset.

Therefore, in one or more embodiments of the present invention, a binder (A), which has a composition different from that of a typical binder and which has relatively low viscosity and high reactivity and incurs low-shrinkage even when the binder goes through crosslinking reaction, is used. The binder has made it possible to use a reactive diluent [epoxy monomer (B)] which could not have been used so far in a bisphenol-A-based epoxy resin or the like. That is, a binder (A) and an epoxy monomer (B) having high compatibility were used.

In addition, a crosslinking agent (C) was used, which functions to relieve internal stress of the conductive paste composition even when the binder (A) is crosslinked.

Thus, with regard to the binder (A), the epoxy monomer (B), the crosslinking agent (C), and the conductive filler (D), which constitute the conductive paste composition, as well as other raw materials (additives), explanation is provided below.

<Binder (A)>

Examples of binders include a homo-condensate of a compound represented by the following general formula (I), or a condensate of the compound represented by the general formula (I) and a compound represented by the general formula (II), with the condensate including a reactive oligomer having a siloxane bond as a main skeleton and comprising a plurality of oxirane rings as an organic group. The binder (A) may be used alone or in combination of two or more.

General formula (I):

$$R^1-(SiR^2_a(OR^3)_{3-a}) \quad (I)$$

In the general formula (I), $R^1$ is an alkyl group having 1 to 10 carbon atoms, the terminal of which is substituted with an epoxy-structure-containing group, each of $R^2$ is independently a hydrogen atom or a monovalent hydrocarbon group selected from an alkyl group having 1 to 10 carbon atoms, an aryl group having 6 to 25 carbon atoms and an aralkyl group having 7 to 12 carbon atoms, and each of $R^3$ is independently a hydrogen atom or an alkyl group having 1 to 10 carbon atoms. a is an integer of 0 to 2. Thus, the compound represented by the general formula (I) is a silane compound (I) having a hydrolyzable silyl group.

General formula (II):

$$R^4-(SiR^2_a(OR^3)_{3-a}) \quad (II)$$

In the general formula (II), $R^4$ is selected from a substituted or unsubstituted alkyl group having 1 to 10 carbon atoms, an alkenyl group and a substituted aryl group, and does not have an epoxy-structure-containing group. Each of $R^2$ is independently a hydrogen atom or a monovalent hydrocarbon group selected from an alkyl group having 1 to 10 carbon atoms, an aryl group having 6 to 25 carbon atoms, and an aralkyl group having 7 to 12 carbon atoms. Each of $R^3$ is independently a hydrogen atom or an alkyl group having 1 to 10 carbon atoms. a is an integer of 0 to 2. Therefore, the compound represented by the general formula (II) is also a silane compound (II) having a hydrolysable silyl group.

Examples of the condensate of the silane compound (I) and the silane compound (II), which is an example of the binder, include a condensate with a weight average molecular weight of 30,000 or less obtained by hydrolysis and condensation of the silane compounds (I) and (II) with a molar ratio of the latter to the former being 9 or less, in the presence of a neutral salt catalyst. Y/X, which is ratio of the mole number Y of the $OR^3$ group directly bonded to the silicon atoms of the condensate (A) to the mole number X of the $OR^3$ group directly bonded to the silicon atoms of the silane compound (I) and the silane compound (II) is, for example, 0.2 or less.

Substituents of the general formula (I) and the general formula (II) are as follows.

Examples of the alkyl group of $R^1$ of the general formula (I), which has 1 to 10 carbon atoms and the terminal of which is substituted with an epoxy structure-containing group, include a methyl group, an ethyl group, a propyl group, an isopropyl group, a butyl group, an isobutyl group, an amyl group, an isoamyl group, a hexyl group, a cyclohexyl group, a cyclohexylmethyl group, a heptyl group, an isoheptyl group, a n-octyl group, an isooctyl group or a 2-ethylhexyl group, or the like. From the viewpoint of reactivity (mobility) of the epoxy group at the time of curing, a methyl group, an ethyl group, a propyl group, an isopropyl group, a butyl group or an isobutyl group may be preferable, and an ethyl group or a propyl group may be more preferable.

The epoxy structure-containing group in $R^1$ of the general formula (I) may be any epoxy group-containing functional group. Examples include an epoxy group, a glycidyl ether group (i.e., a glycidoxy group) or an epoxycyclohexyl group, or the like. A glycidyl ether group or an epoxycyclohexyl group may be preferable from the viewpoint of reactivity or the like.

Note that the term "terminal" refers to a methyl group which is at the most distant position from Si when the alkyl group is a straight chain. In the case of an alkyl group having a branched chain, it refers to a methyl group which is at the most distant position from Si possessed by the main chain and/or a methyl group which is at the most distant position from Si possessed by one or two or more branched chains.

$R^2$ of the general formulas (I) and (II) is a hydrogen atom or a monovalent hydrocarbon group selected from an alkyl group having 1 to 10 carbon atoms, an aryl group having 6 to 25 carbon atoms and an aralkyl group having 7 to 12 carbon atoms. Examples of such a hydrocarbon group include a methyl group, an ethyl group, a propyl group, a butyl group, a pentyl group, a hexyl group, an octyl group, a nonyl group, a decyl group, a phenyl group, a tolyl group, a xylyl group, a naphthyl group, a benzyl group or a phenethyl group, etc. From the viewpoint of reactivity and the like, $R^2$ may be preferably a hydrogen atom, a methyl group, an ethyl group or a propyl group, and more preferably a methyl group or an ethyl group.

$R^2$ of the general formulas (I) and (II) is a hydrogen atom or an alkyl group having 1 to 10 carbon atoms. Examples of alkyl groups include a methyl group, an ethyl group, a propyl group, a butyl group, a pentyl group, a hexyl group, an octyl group, a nonyl group or a decyl group, etc. From the viewpoint of easy hydrolysis and condensation of a silane compound having a hydrolyzable silyl group, the number of carbon atoms of the alkyl group of $R^3$ may be preferably 1 to 3, and most preferably 1.

$R^4$ of the general formula (II) is a group which is selected from a substituted or unsubstituted alkyl group having 1 to 10 carbons, an alkenyl group and a substituted aryl group, and which does not have an epoxy group.

Examples of the alkyl group include a methyl group, an ethyl group, a propyl group, an isopropyl group, a butyl group, an isobutyl group, a pentyl group, an amyl group, an isoamyl group, a hexyl group, a cyclohexyl group, a cyclohexylmethyl group, a cyclohexylethyl group, a heptyl group, an isoheptyl group, an n-octyl group, an isooctyl group, a 2-ethylhexyl group, a nonyl group or a decyl group, etc.

Examples of substituents of the alkyl group include a thiol group, an amino group, an isocyanato group, a (meth)acryloyl group, a phenyl group or a chlorine group, etc.

Examples of alkenyl groups include a vinyl group, an allyl group, a 1-methylethenyl group, a 2-methylethenyl group, a 2-propenyl group, a 1-methyl-3-propenyl group, a 3-butenyl group, a 4-pentenyl group, a 5-hexenyl group, a cyclohexenyl group, a bicyclohexenyl group, a 6-heptenyl group, a 7-octenyl group, a decenyl group, a pentadecenyl group, an eicosenyl group or a tricosenyl group, etc.

Examples of substituted aryl groups include a styryl group, etc.

Among these, when $R^4$ is an unsubstituted alkyl group, the number of carbon atoms may be preferably 3 or more and 10 or less, and more preferably 3 or more and 6 or less from the viewpoint of good storage stability, high curing rate at the time of irradiation with active energy-ray and inhibition of crack generation of the obtained coating film.

From the same viewpoints, when $R^4$ is a substituted alkyl group, the number of carbon atoms of a portion other than the substituent may be preferably 3 or more and 10 or less, more preferably 3 or more and 6 or less, and the substituent is preferably a phenyl group, a cyclohexyl group or a (meth)acryloyl group, etc.

From the same viewpoints, when $R^4$ is an alkenyl group, $R^4$ may be preferably a vinyl group or an allyl group and the like.

When $R^4$ is an unsubstituted alkyl group having 3 or more carbon atoms, when $R^4$ is a substituted alkyl group with the portion other than the substituent having 3 carbon atoms or more, or when $R^4$ is a substituted alkyl group and the substituent is a phenyl group, a cyclohexyl group or a (meth)acryloyl group, a dense crosslinked structure is not easily formed during crosslinking and gelation does not easily occur.

When $R^4$ is an unsubstituted alkyl group having 10 or less carbon atoms, when $R^4$ is a substituted alkyl group with the portion other than the substituent having 10 or less carbon atoms, or when $R^4$ is a substituted alkyl group and the substituent is a phenyl group, a cyclohexyl group or a (meth)acryloyl group, hydrophobicity is not too high, hydrolysis rate is not extremely lowered, nor is curing rate during irradiation with active energy-ray easily lowered.

a in the general formulas (I) and (II) is an integer of 0 to 2 and is appropriately selected depending upon physical properties required for the curable composition.

Examples of the silane compound (I) include glycidyl group-containing silanes, such as 1-glycidyloxymethyl trimethoxysilane, 1-glycidyloxymethyl methyl dimethoxysilane, 1-glycidyloxymethyl triethoxysilane, 1-glycidyloxymethyl methyl diethoxysilane, 2-glycidyloxyethyl trimethoxysilane, 2-glycidyloxyethyl methyl dimethoxysilane, 2-glycidyloxyethyl triethoxysilane, 2-glycidyloxyethyl methyl diethoxysilane, 3-glycidyloxypropyl trimethoxysilane, 3-glycidyloxypropyl methyl dimethoxysilane, 3-glycidyloxypropyl triethoxysilane, 3-glycidyloxypropyl methyl diethoxysilane, 4-glycidyloxybutyl trimethoxysilane, 4-glycidyloxybutyl methyl dimethoxysilane, 4-glycidyloxybutyl triethoxysilane, 4-glycidyloxybutyl methyl diethoxysilane, 6-glycidyloxyhexyl trimethoxysilane, 6-glycidyloxyhexyl methyl dimethoxysilane, 6-glycidyloxyhexyl triethoxysilane, 6-glycidyloxyhexyl methyl diethoxysilane, 8-glycidyloxyoctyl trimethoxysilane, 8-glycidyloxyoctyl methyl dimethoxysilane, 8-glycidyloxyoctyl triethoxysilane, and 8-glycidyloxyoctyl methyl diethoxysilane, etc.; alicyclic epoxy group-containing silanes, such as 1-(3,4-epoxycyclohexyl)methyl trimethoxysilane, 1-(3,4-epoxycyclohexyl)methyl methyl dimethoxysilane, 1-(3,4-epoxycyclohexyl)methyl triethoxysilane, 1-(3,4-epoxycyclohexyl)methyl methyl diethoxysilane, 2-(3,4-epoxycyclohexyl)ethyl trimethoxysilane, 2-(3,4-epoxycyclohexyl)ethyl methyl dimethoxysilane, 2-(3,4-epoxycyclohexyl)ethyl triethoxysilane, 2-(3,4-epoxycyclohexyl)ethyl methyl diethoxysilane, 3-(3,4-epoxycyclohexyl)propyl trimethoxysilane, 3-(3,4-epoxycyclohexyl)propyl methyl dimethoxysilane, 3-(3,4-epoxycyclohexyl)propyl triethoxysilane, 3-(3,4-epoxycyclohexyl)propyl methyl diethoxysilane, 4-(3,4-epoxycyclohexyl)butyl trimethoxysilane, 4-(3,4-epoxycyclohexyl)butyl methyl dimethoxysilane, 4-(3,4-epoxycyclohexyl)butyl triethoxysilane, 4-(3,4-epoxycyclohexyl)butyl methyl diethoxysilane, 6-(3,4-epoxycyclohexyl)hexyl trimethoxysilane, 6-(3,4-epoxycyclohexyl)hexyl methyl dimethoxysilane, 6-(3,4-epoxycyclohexyl)hexyl triethoxysilane, 6-(3,4-epoxycyclohexyl)hexyl methyl diethoxysilane, 8-(3,4-epoxycyclohexyl)octyl trimethoxysilane, 8-(3,4-epoxycyclohexyl)octyl methyl dimethoxysilane, 8-(3,4- epoxycyclohexyl)octyl triethoxysilane and 8-(3,4-epoxycyclohexyl)octyl methyl diethoxysilane, etc.; and epoxy group-containing silanes, such as epoxy trimethoxysilane, epoxymethyl dimethoxysilane, epoxy triethoxysilane, epoxy methyl diethoxysilane, 1-epoxymethyl trimethoxysilane, 1-epoxymethyl methyl dimethoxysilane, 1-epoxymethyl triethoxysilane, 1-epoxymethyl methyl diethoxysilane, 2-epoxyethyl trimethoxysilane, 2-epoxyethyl methyl dimethoxysilane, 2-epoxyethyl triethoxysilane, 2-epoxyethyl methyl diethoxysilane, 3-epoxypropyl trimethoxysilane, 3-epoxypropyl methyl dimethoxysilane, 3-epoxypropyl triethoxysilane, 3-epoxypropyl methyl diethoxysilane, 4-epoxybutyl trimethoxysilane, 4-epoxybutyl methyl dimethoxysilane, 4-epoxybutyl triethoxysilane, 4-epoxybutyl methyl diethoxysilane, 6-epoxyhexyl trimethoxysilane, 6-epoxyhexyl methyl dimethoxysilane, 6-epoxyhexyl triethoxysilane, 6-epoxyhexyl methyl diethoxysilane, 8-epoxyoctyl trimethoxysilane, 8-epoxyoctyl methyl dimethoxysilane, 8-epoxyoctyl triethoxysilane and 8-epoxyoctyl methyl diethoxysilane, etc.

In one or more embodiments, from the viewpoint of easy hydrolysis and condensation of a silane compound having a hydrolysable silyl group, the alkyl group of $R^3$ in the general formula (I) preferably has 1 to 3 carbon atoms, and most preferably 1 carbon atom. From the viewpoint of reactivity (mobility) of the epoxy group during curing, the number of carbon atoms of the alkylene group which bonds the epoxy group and the silicon atom is important, and the number of the carbon atoms is preferably 1 to 4, more preferably 2 or 3. Upon putting together these viewpoints, the silane compound (I) is preferably, inter alia, a compound in which $R^1$ is a 2-(3,4-epoxycyclohexyl)ethyl group or a 3-glycidyloxypropyl group.

In one or more embodiments, preferred examples include 2-(3,4-epoxycyclohexyl)ethyl trimethoxysilane, 2-(3,4-epoxycyclohexyl)ethyl methyl dimethoxysilane, 3-(3,4-epoxycyclohexyl)propyl trimethoxysilane, 3-(3,4-epoxycyclohexyl)propyl methyl dimethoxysilane, 2-glycidyloxyethyl trimethoxysilane, 2-glycidyloxyethyl methyl dimethoxysilane, 3-glycidyloxypropyl trimethoxysilane or 3-glycidyloxypropyl methyl dimethoxysilane.

Examples of the silane compound (II) in which $R^4$ is an unsubstituted alkyl group include methyl trimethoxysilane, dimethyl dimethoxysilane, methyl triethoxysilane, dimethyl diethoxysilane, ethyl trimethoxysilane, ethyl methyl dimethoxysilane, ethyl triethoxysilane, ethyl methyl diethoxysilane, propyl trimethoxysilane, propyl methyl dimethoxysilane, propyl triethoxysilane, propyl methyl diethoxysilane, butyl trimethoxysilane, butyl methyl dimethoxysilane, butyl triethoxysilane, butyl methyl diethoxysilane, hexyl trimethoxysilane, hexyl methyl dimethoxysilane, hexyl triethoxysilane, hexyl methyl diethoxysilane, octyl trimethoxysilane, octyl methyl dimethoxysilane, octyl triethoxysilane or octyl methyl diethoxysilane, etc.

Examples of the silane compound of the general formula (II) in which $R^4$ is a substituted alkyl group include the following. There is no particular limitation on the substituent, but from the viewpoint of availability, a thiol group, an isocyanato group, a (meta)acryloyl group, a phenyl group, a cyclohexyl group or a chlorine group, etc. may be preferred.

However, among these substituents, since the thiol (mercapto) group may react with the epoxy group during hydrolysis and condensation reaction of the hydrolysable silyl group, it may be preferable to select as the silane compound (I) an epoxy silane compound having an epoxycyclohexyl group which is not susceptible to nucleophilic attack.

On the other hand, a silane compound having an amino group or an acid anhydride group as the substituent may not be preferable to be used in the present application, because such a silane compound has equal to or higher possibility of reacting with an epoxy group during hydrolysis and condensation reaction of the hydrolysable silyl group than a mercapto group.

Examples of the compounds in which $R^4$ is a thiol group-substituted alkyl group include 1-mercaptomethyl trimethoxysilane, 1-mercaptomethyl methyl dimethoxysilane, 1-mercaptomethyl triethoxysilane, 1-mercaptomethyl methyl diethoxysilane, 2-mercaptoethyl trimethoxysilane, 2-mercaptoethyl methyl dimethoxysilane, 2-mercaptoethyl triethoxysilane, 2-mercaptoethyl methyl diethoxysilane, 3-mercaptopropyl trimethoxysilane, 3-mercaptopropyl methyl dimethoxysilane, 3-mercaptopropyl triethoxysilane, 3-mercaptopropyl methyl diethoxysilane, 4-mercaptobutyl trimethoxysilane, 4-mercaptobutyl methyl dimethoxysilane, 4-mercaptobutyl triethoxysilane, 4-mercaptobutyl methyl diethoxysilane, 6-mercaptohexyl trimethoxysilane, 6-mercaptohexyl methyl dimethoxysilane, 6-mercaptohexyl triethoxysilane, 6-mercaptohexyl methyl diethoxysilane, 8-mercaptooctyl trimethoxysilane, 8-mercaptooctyl methyl dimethoxysilane, 8-mercaptooctyl triethoxysilane and 8-mercaptooctyl methyl diethoxysilane, etc.

Examples of the compounds in which $R^4$ is an isocyanato group-substituted alkyl group include 1-isocyanatomethyl trimethoxysilane, 1-isocyanatomethyl methyl dimethoxysilane, 1-isocyanatomethyl triethoxysilane, 1-isocyanatomethyl methyl diethoxysilane, 2-isocyanatoethyl trimethoxysilane, 2-isocyanatoethyl methyl dimethoxysilane, 2-isocyanatoethyl triethoxysilane, 2-isocyanatoethyl ethyl diethoxysilane, 3-isocyanatopropyl trimethoxysilane, 3-isocyanatopropyl methyl dimethoxysilane, 3-isocyanatopropyl triethoxysilane, 3-isocyanatopropyl methyl diethoxysilane, 4-isocyanatobutyl trimethoxysilane, 4-isocyanatobutyl methyl dimethoxysilane, 4-isocyanatobutyl triethoxysilane, 4-isocyanatobutyl methyl diethoxysilane, 6-isocyanatohexyl trimethoxysilane, 6-isocyanatohexyl methyl dimethoxysilane, 6-isocyanatohexyl triethoxysilane, 6-isocyanatohexyl methyl diethoxysilane, 8-isocyanatooctyl trimethoxysilane, 8-isocyanatooctyl methyl dimethoxysilane, 8-isocyanatooctyl triethoxysilane and 8-isocyanatooctyl methyl diethoxysilane, etc.

Examples of compounds in which $R^4$ is a (meth)acryloyl group-substituted alkyl group include 1-(meth)acryloyloxymethyl trimethoxysilane, 1-(meth)acryloyloxymethyl methyl dimethoxysilane, 1-(meth)acryloyloxymethyl triethoxysilane, 1-(meth)acryloyloxymethyl methyl diethoxysilane, 2-(meth)acryloyloxyethyl trimethoxysilane, 2-(meth)acryloyloxyethyl methyl dimethoxysilane, 2-(meth)acryloyloxyethyl triethoxysilane, 2-(meth)acryloyloxyethyl methyl diethoxysilane, 3-(meth)acryloyloxypropyl trimethoxysilane, 3-(meth)acryloyloxypropyl methyl dimethoxysilane, 3-(meth)acryloyloxypropyl triethoxysilane, 3-(meth)acryloyloxypropyl methyl diethoxysilane, 4-(meth)acryloyloxybutyl trimethoxysilane, 4-(meth)acryloyloxybutyl methyl dimethoxysilane, 4-(meth)acryloyloxybutyl triethoxysilane, 4-(meth)acryloyloxybutyl methyl diethoxysilane, 6-(meth)acryloyloxyhexyl trimethoxysilane, 6-(meth)acryloyloxyhexyl methyl dimethoxysilane, 6-(meth)acryloyloxyhexyl triethoxysilane, 6-(meth)acryloyloxyhexyl methyl diethoxysilane, 8-(meth)acryloyloxyoctyl trimethoxysilane, 8-(meth)acryloyloxyoctyl methyl dimethoxysilane, 8-(meth)acryloyloxyoctyl triethoxysilane and 8-(meth)acryloyloxyoctyl methyl diethoxysilane, etc.

Examples of the compounds in which R$^4$ is a phenyl-substituted alkyl group include benzyl trimethoxysilane, benzyl triethoxysilane, 2-phenylethyl trimethoxysilane, 2-phenylethyl triethoxysilane, 3-phenylpropyl trimethoxysilane, 3-phenylpropyl triethoxysilane, 4-phenylbutyl trimethoxysilane, 4-phenylbutyl triethoxysilane, 5-phenylpentyl trimethoxysilane, 5-phenylpentyl triethoxysilane, 6-phenylhexyl trimethoxysilane and 6-phenylhexyl triethoxysilane, etc.

Examples of the compounds in which R$^4$ is a cyclohexyl group-substituted alkyl group include cyclohexylmethyl trimethoxysilane, cyclohexylmethyl triethoxysilane, 2-cyclohexylethyl trimethoxysilane, 2-cyclohexylethyl triethoxysilane, 3-cyclohexylpropyl trimethoxysilane, 3-cyclohexylpropyl triethoxysilane, 4-cyclohexylbutyl trimethoxysilane, 4-cyclohexylbutyl triethoxysilane, 5-cyclohexylpentyl trimethoxysilane, 5-cyclohexylpentyl triethoxysilane, 6-cyclohexylhexyl trimethoxysilane and 6-cyclohexylhexyl triethoxysilane, etc.

Examples of the compounds in which R$^4$ is a chlorine group-substituted alkyl group include chloromethyl trimethoxysilane, chloromethyl triethoxysilane, 2-chloroethyl trimethoxysilane, 2-chloroethyl triethoxysilane, 3-chloropropyl trimethoxysilane, 3-chloropropyl triethoxysilane, 4-chlorobutyl trimethoxysilane, 4-chlorobutyl triethoxysilane, 5-chloropentyl trimethoxysilane, 5-chloropentyl triethoxysilane, 6-chlorohexyl trimethoxysilane and 6-chlorohexyl triethoxysilane, etc.

Examples of the compounds in which R$^4$ is an alkenyl group include vinyl trimethoxysilane, vinyl methyl dimethoxysilane, vinyl triethoxysilane, vinyl methyl diethoxysilane, allyl trimethoxysilane, allyl methyl dimethoxysilane, allyl triethoxysilane, allyl methyl diethoxysilane, 1-oxetanyloxymethyl trimethoxysilane, 1-oxetanyloxymethyl methyl dimethoxysilane, 1-oxetanyloxymethyl triethoxysilane, 1-oxetanyloxymethyl methyl diethoxysilane, 2-oxetanyloxyethyl trimethoxysilane, 2-oxetanyloxyethyl methyl dimethoxysilane, 2-oxetanyloxyethyl triethoxysilane, 2-oxetanyloxyethyl methyl diethoxysilane, 3-oxetanyloxypropyl trimethoxysilane, 3-oxetanyloxypropyl methyl dimethoxysilane, 3-oxetanyloxypropyl triethoxysilane, 3-oxetanyloxypropyl methyl diethoxysilane, 4-oxetanyloxybutyl trimethoxysilane, 4-oxetanyloxybutyl methyl dimethoxysilane, 4-oxetanyloxybutyl triethoxysilane, 4-oxetanyloxybutyl methyl diethoxysilane, 6-oxetanyloxyhexyl trimethoxysilane, 6-oxetanyloxyhexyl methyl dimethoxysilane, 6-oxetanyloxyhexyl triethoxysilane, 6-oxetanyloxyhexyl methyl diethoxysilane, 8-oxetanyloxyoctyl trimethoxysilane, 8-oxetanyloxyoctyl methyl dimethoxysilane, 8-oxetanyloxyoctyl triethoxysilane and 8-oxetanyloxyoctyl methyl diethoxysilane, etc.

Examples of the compounds in which R$^4$ is a substituted aryl group include p-styryl trimethoxysilane and p-styryl triethoxysilane, etc.

Among them, from the viewpoints of storage stability, curing rate, inhibition of crack generation, and the like, examples of the silane compound (II) include methyl trimethoxysilane, 1-(meth)acryloyloxymethyl trimethoxysilane, benzyl trimethoxysilane, cyclohexylmethyl trimethoxysilane, vinyl trimethoxysilane and p-styryl trimethoxysilane, etc.

With regard to each of the silane compounds (I) and (II), it is sufficient that one or more species are contained in the condensate to serve as a binder. For example, one species of each of the silane compounds (I) and (II) may be contained or two species of each of the silane compounds (I) and (II) may be contained. Alternatively, one species of one of the silane compounds (I) and (II) may be included, and two or more species of the other may be contained. When compounds of two or more species are included, use ratio of each compound may be any.

When the conductive paste composition requires abrasion resistance or chemical resistance, the binder may be preferably obtained by hydrolysis and condensation under the condition that the molar ratio of the silane compound (II) to the silane compound (I) (number of moles of the silane compound (II)/number of moles of the silane compound (I)) is 0 or more and 9 or less.

The molar ratio of the silane compound having a functional group other than the epoxy structure-containing group, such as a (meth)acryloyl group, to the silane compound (I) exceeding 9 allows one to obtain a cured product having high abrasion resistance or high chemical resistance, but renders cure shrinkage larger than the crosslinking by the epoxy group, so that cracks may occur when the cured product is placed under the load with heat or humidity. Contrary to this, curing by the epoxy structure-containing group accompanies a ring opening reaction, and therefore shrinkage is small. This enables one to obtain a cured product almost without curing shrinkage.

In addition, a decrease in a content of the epoxy-structure-containing group in the binder results in insufficient intermolecular crosslinking, resulting in concern that the hardness or scratch resistance is lowered. Therefore, in consideration of hard coating properties (i.e., hardness or scratch resistance), the molar ratio of the silane compound (II) to the silane compound (I) may be more preferably 0 or more and 5 or less, even more preferably 0 or more and 3 or less, and particularly preferably 0 or more and 1 or less.

In one or more embodiments, a preferred binder in the conductive paste composition is a 2 to 200 mers which is obtained by hydrolysis and condensation of silane compounds and in which a siloxane bond is formed.

The weight average molecular weight of the binder may be preferably 500 or more, more preferably 1,000 or more, and even more preferably 2,000 or more. The weight average molecular weight of the binder may be preferably 30,000 or less, more preferably 28,000 or less, and even more preferably 25,000 or less.

When the weight-average molecular weight of a binder is 500 or more, the binder does not easily become volatile. Therefore, in the case where the diluent is removed by heating prior to curing by irradiating the binder with UV rays, it is possible to effectively inhibit a part or entirety of the binder from volatilizing. In addition, the weight average molecular weight does not become too low, and this allows a sufficient impact resistance to be easily secured.

On the other hand, in the case where the weight-average molecular weight of the binder is 30,000 or less, the compatibility of the binder with other formulated components is not easily lowered, resulting in easy control of white turbidity at the time of forming a coating film. Here, the weight average molecular weight is a weight average molecular weight measured by GPC.

Note that since a binder having a weight average molecular weight of less than 500 has a low molecular weight and a low viscosity, it may be preferable to prepare a coating solution containing the binder without using a diluent solvent. In this case, it is not necessary to heat the binder to remove the diluent solvent before ultraviolet irradiation.

The weight average molecular weight of the siloxane resin (binder), which is a condensation product, can be controlled by appropriately selecting the amount of water used in the reaction, and the type and the amount of the catalyst. For example, the weight average molecular weight can be increased by increasing the amount of water initially charged.

Y/X, which is ratio of the mole number Y of the $OR^3$ group directly bonded to the silicon atoms of the binder to the mole number X of the $OR^3$ group directly bonded to the silicon atoms of the silane compound (I) and the silane compound (II), which are raw materials for the binder, may be preferably 0.2 or less, more preferably 0.1 or less, even more preferably 0.05 or less, and the most preferably substantially 0.

Y/X of 0.2 or less is less likely to cause the coating film to contract with time after irradiation with active energy—rays, and this enables easy control in crack generation. Here, Y/X can be obtained by measuring with $^1$H-NMR and $^{29}$Si-NMR. Note that Y/X can be made 0.2 or less by appropriately selecting the amount of water used in the reaction, and the type and the amount of the catalyst. For example, the higher the amount of water, the more promoted the hydrolysis, and the value of Y/X is lowered.

The number of $OR^3$ groups remaining in one molecule of the binder may be preferably equal to or less than 2, more preferably equal to or less than 1, even more preferably equal to or less than 0.5, still more preferably equal to or less than 0.1, and the most preferably substantially no $OR^3$ groups remain, from the viewpoint of inhibition, and the like of coating film shrinkage and crack generation.

From the viewpoint of increasing the crosslinking point density and improving hardness and scratch resistance of the cured product, it may be preferable that the residual ratio of the epoxy structure containing group in the binder, that is, the ratio of the number of moles of the epoxy structure-containing group in the binder to the number of moles of the epoxy structure-containing group in the silane compound (I) as the raw material be higher.

Decrease in the content of the epoxy-structure-containing group in the condensate (binder) formed of the silane compound (I) and the silane compound (II) results in concern that intermolecular crosslinking becomes insufficient, resulting in lowered hardness or curability. Therefore, the molar ratio of the silane compound (II) to the silane compound (I) may be more preferably 0 or more and 5 or less, even more preferably 0 or more and 3 or less, and particularly preferably 0 or more and 1 or less.

In the above description, a binder of a condensate of the silane compound (I) and the silane compound (II) is exemplified, but the binder is not limited thereto. For example, even a homo-condensate of the silane compound (I) functions as a binder.

With regard to 100 parts by weight of the total of the binder (A), the epoxy monomer (B), the crosslinking agent (C) and the conductive filler (D), the binder (A) may be contained in an amount of 1 part by weight or more and 10 parts by weight or less, preferably 1.5 parts by weight or more and 8 parts by weight or less, and more preferably 2 parts by weight or more and 7 parts by weight or less.

The binder in an amount of less than 1 part by weight results in a lowered curability of the conductive paste composition. On the other hand, the amount of binder exceeding 10 parts by weight results in difficulty in achievement of lowered electrical resistance of the conductive paste.

<Epoxy Monomer (B)>

As described above, the epoxy monomer (B), which is a reactive diluent, has high compatibility with the binder (A). The molecular structure of the epoxy monomer is a polyether structure. It is inferred that the ether structure has a linear structure and therefore reduces entanglement between molecules; this results in easy disentanglement of molecules against external stress such as tension and compression; and this releases internal stress in the conductive paste composition. In addition, it is inferred that shrinkage of the conductive paste composition at the time of curing is alleviated for the same reason as described above, and low warpage can be achieved. The epoxy monomer (B) may be used alone or in combination of two or more.

Although there is no particular limitation on the ether structure, it may be preferable that the ether structure is linear. It is more preferable to have a plurality of ether structures than to have a single ether structure in terms of internal stress relaxation. The number of epoxy functional groups contained in the monomer having an ether structure is not particularly limited, but two may be preferable in view of the balance between the internal stress relaxation and the curability.

On the other hand, as a limitation on the epoxy functional group, it is essential to have one epoxy functional group at the molecular end of at least one of both ends of the monomer. The effect of the number of functional groups on warpage is in that having a single functional group enables the monomer to function as a chain-extender for the binder, because the monomer itself does not participate in cross-linking during curing of the conductive paste.

Furthermore, since the functional group is at the terminal, the molecular portion other than the functional group of the epoxy monomer is arranged in a comb-like manner between the binders, and the comb-like chain functions as a plasticizer. It is inferred from these that warpage due to cure shrinkage of the conductive paste composition is inhibited.

The molecular structure other than the functional group is not particularly limited, and may be any of a linear, aromatic or alicyclic structure.

In view of the above, it may be preferable that the epoxy monomer (B) comprises at least one selected from the group consisting of a bifunctional monomer having a glycol structure and a monofunctional monomer having an aliphatic structure.

Examples of glycol structures include ethylene glycol, diethylene glycol, polyethylene glycol, propylene glycol or polypropylene glycol, etc.

The degree of polymerization, n, of polyethylene glycol or polypropylene glycol is 30 or less, preferably 20 or less, and more preferably 10 or less from the viewpoint of the viscosity problem of the formulation.

Examples of monofunctional monomers having an aliphatic structure include alkyl monoglycidyl ether, alkyl mono 3,4-epoxycyclohexane, an ester of 3,4-epoxycyclohexane alcohol and a carboxylic acid and alkyl monooxetane. Examples thereof include neopentyl monoglycidyl ether, butyl glycidyl ether, dodecyl glycidyl ether, cetyl glycidyl ether, 1-vinyl-3,4-epoxycyclohexane, 1-methylol-3,4-epoxycyclohexane, 2-ethylhexyl=3,4-epoxycyclohexanecarboxylate, 3-ethyl-3-hydroxymethyl oxetane or 2-ethylhexyl oxetane, etc.

In addition, for example, in the case of an electrode made of a conductive paste composition containing a bisphenol A-based epoxy resin as a binder and an alicyclic epoxy resin as an epoxy monomer, a relatively high resistance is obtained, but in the case of an electrode of a conductive paste composition containing the binder (A) and the epoxy monomer (B), electric resistance can be suppressed.

Dodecyl glycidyl ether, cetyl glycidyl ether, or 2-ethylhexyl=3,4-epoxycyclohexanecarboxylate may be preferred in terms of balance among reactivity, flexibility-imparting property or an electrical resistivity inhibition effect.

With regard to 100 parts by weight of the total of the binder (A), the epoxy monomer (B), the crosslinking agent (C) and the conductive filler (D), the epoxy monomer (B) may be contained in an amount of 2 parts by weight or more and 20 parts by weight or less, preferably 2 parts by weight or more and 15 parts by weight or less, and more preferably 3 parts by weight or more and 10 parts by weight or less.

An amount of the epoxy monomer of less than 2 parts by weight increases the viscosity of the conductive paste composition and decreases the effect of improving warpage. On the other hand, an amount of the epoxy monomer exceeding 10 parts by weight decreases the viscosity as well as the curability of the conductive paste composition.

<Crosslinking Agent (C)>

The crosslinking agent functions to relieve the internal stress as the conductive paste composition, when the binder crosslinks. As the crosslinking agent, materials which can be heat-dried and fired at a relatively low temperature of 200° C. or less and which prevent an increase in electric resistivity are used in order to prevent damage to an object to which the conductive paste composition adheres. The crosslinking agent (C) may be used alone or in combination of two or more.

Though the mechanism for preventing an increase in the resistivity is not clarified in detail, it may be preferable to reduce crosslinking density to the extent that the reduction does not affect the curability of the conductive paste. The crosslinking agent may be preferably a compound having a heat latent property or an ultraviolet ray-reactive compound, because the crosslinking agent may be preferably stable at an ambient temperature of about 25° C. in a one-part formulation. Examples include an acid anhydride, a hydrazine compound, a boron trifluoride complex, a dicyandiamide compound, a cyanamide compound, an imidazole compound, a photoacid generator or a photobase generator, etc. Among them, an acid anhydride, a hydrazine compound, an imidazole compound or a photobase generator may be preferable from the viewpoints of formulation into a conductive paste composition, storage stability when the crosslinking agent is formulated into a one-part composition, curing activity or corrosion resistance against a conductive filler.

Examples of acid anhydride include propionic anhydride, butyric anhydride, octanoic anhydride, 2-ethylhexanoic anhydride, maleic anhydride, fumaric anhydride, acetic anhydride, phthalic anhydride, 1,2,3,6-tetrahydrophthalic anhydride, 3,4,5,6-tetrahydrophthalic anhydride, hexahydrophthalic anhydride, succinic anhydride, 4-methylhexahydrophthalic anhydride, methylbicyclo[2.2.1]heptane-2,3-dicarboxylic anhydride, ethylene glycol bis-anhydro trimellitate, ethylene glycol bis-anhydro trimellitate, ethylene glycol bis-anhydro trimellitate, ethylene glycol bis-anhydro trimellitate, ethylene glycol bis-anhydro trimellitate, glycerin bis-anhydro trimellitate mono-acetate, succinic anhydride, tetrapropenyl succinic anhydride (3-dodecyl succinic anhydride) or 2-octenyl succinic anhydride, etc. In one or more embodiments, the acid anhydride preferably has a hydrocarbon group of C6 or more. The acid anhydride having a long carbon chain of C6 or more easily improves the miscibility between the binder (A) and the acid anhydride. In one or more embodiments, it is also preferred that the acid anhydride has at least one double bond in the carbon chain. The at least one double bond in the carbon chain effectively decreases the melting point of the acid anhydride, resulting in better miscibility in preparing the conductive paste composition. In these viewpoints, the acid anhydride may be preferably 2-octenyl succinic anhydride.

Examples of hydrazine compounds include hydrazine monohydrochloride, hydrazine dihydrochloride, hydrazine monohydrobromide, hydrazine carbonate, adipic dihydrazide, sebacic dihydrazide, dodecanediohydrazide, isophthalic dihydrazide, propionic hydrazide, salicylic hydrazide, hydroxy-2-naphthoic acid hydrazide, benzophenone hydrazone, 3-hydroxy-2-naphthoic acid hydrazide, benzophenone hydrazone or a polyacrylamide-based aqueous crosslinking agent, etc.

Examples of boron trifluoride complexes include a boron trifluoride ethyl ether complex, a boron trifluoride methyl ether complex, a boron trifluoride ethyl methyl ether complex, a boron trifluoride butyl ether complex, a boron trifluoride phenol complex, a boron trifluoride alkylamine complex, an ammonium boron trifluoride complex, a boron trifluoride piperidine complex, a boron trifluoride triethanolamine complex, a boron trifluoride alcohol complex, a boron trifluoride ketone complex, a boron trifluoride aldehyde complex, a boron trifluoride ester complex, a boron trifluoride acid anhydrous complex or a boron trifluoride acid complex, etc.

Examples of dicyandiamide compounds include dicyandiamide, o-tolylbiguanide and diphenylbiguanide, etc.

Examples of cyanamide compound include monomethylcyanamide, monoethylcyanamide, monopropylcyanamide, monobutylcyanamide, dimethylcyanamide, diethylcyanamide, dipropylcyanamide, dibutylcyanamide, hexamethylene dicyanamide, heptamethylene dicyanamide, octamethylene dicyanamide, nonamethylene dicyanamide or decamethylene dicyanamide, etc.

Examples of imidazole compounds include imidazole, 1-methylimidazole, 2-methylimidazole, 3-methylimidazole, 4-methylimidazole, 5-methylimidazole, 1-ethylimidazole, 2-ethylimidazole, 3-ethylimidazole, 4-ethylimidazole, 5-ethylimidazole, 1-n-propylimidazole, 2-n-propylimidazole, 1-isopropylimidazole, 2-isopropylimidazole, 1-n-butylimidazole, 2-n-butylimidazole, 1-isobutylimidazole, 2-isobutylimidazole, 2-undecyl-1H-imidazole, 2-heptadecyl-1H-imidazole, 1,2-dimethylimidazole, 1,3-dimethylimidazole, 2,4-dimethylimidazole, 2-ethyl-4-methylimidazole, 1-phenylimidazole, 2-phenyl-1H-imidazole, 4-methyl-2-phenyl-1H-imidazole, 2-phenyl-4-methylimidazole, 1-benzyl-2-methylimidazole, 1-benzyl-2-phenylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 2-phenyl-4,5-dihydroxymethyl imidazole, 2-phenyl-4-methyl-5-hydroxymethylimidazole or 1-cyanoethyl-2-phenyl-4,5-di(2-cyanoethoxy)methylimidazole, etc.

Examples of the photobase generator include [4-(4-acetyl)phenylthio]phenyl diphenylsulfonium tris (pentafluoroethyl)trifluorophosphate, [4-(4-acetyl)phenylthio]phenyl diphenylsulfonium tetrakis (pentafluorophenyl)borate, [4-(4-acetyl)phenylthio]phenyl diphenylsulfonium tris (trifluoromethanesulfonyl)methide, [4-(4-acetyl)phenylthio]phenyl diphenylsulfonium hexafluoroantimonate, [4-(4-acetyl)phenylthio]phenyl diphenylsulfonium hexafluorophosphate, [4-(4-acetyl)phenylthio]phenyl diphenylsulfonium trifluoromethane sulfonate, [4-(4-acetyl)phenylthio]phenyl diphenylsulfonium nonafluorobutanesulfonate, [4-(4-acetyl)phenylthio]phenyl diphenylsulfonium methanesulfonate, [4-(4-acetyl)phenylthio]phenyl diphenylsulfonium butanesulfonate, [4-(4-acetyl)phenylthio]phenyl diphenylsulfonium camphorsulfonate, [4-(4-acetyl)phenylthio]phenyl diphenylsulfonium p-toluenesulfonate and, [4-(4-benzoyl)phenylthio]phenyl diphenylsulfonium tris (pentafluoroethyl)trifluorophosphate, [4-(4-benzoyl)phenylthio]phenyl diphenylsulfonium tetrakis (pentafluorophenyl)borate, [4-(4-benzoyl)phenylthio]phenyl diphenylsulfonium tris (trifluoromethanesulfonyl) methide, [4-(4-benzoyl)phenylthio] phenyl diphenylsulfonium hexafluoroantimonate, [4-(4-benzoyl)phenylthio]phenyl diphenylsulfonium hexafluorophosphate, [4-(4-benzoyl)phenylthio]phenyl diphenylsulfonium trifluoromethane sulfonate, [4-(4-benzoyl)phenylthio] phenyl diphenylsulfonium nonafluorobutanesulfonate, [4-(4-benzoyl)phenylthio]phenyl diphenylsulfonium methanesulfonate, [4-(4-benzoyl)phenylthio]phenyl diphenylsulfonium butanesulfonate, [4-(4-benzoyl)phenylthio] phenyl diphenylsulfonium camphorsulfonate or [4-(4-benzoyl)phenylthio]phenyl diphenylsulfonium p-toluenesulfonate, etc.

Examples of the photobase generator include α-aminoacetophenone compounds, oxime ester compounds, and tertiary amine compounds having a substituent such as an acyloxyimino group, N-formylated aromatic amino group, an N-acylated aromatic amino group, a nitrobenzylcarbamate group, or an alkoxybenzylcarbamate group, as well as a carboxylic acid salt, a borate, a carbamate, or an amide-based compound of amidine and/or guanidine.

Examples of compounds include 2-methyl-1-(-methylthiophenyl)-2-morpholinopropane-1-one, 2-benzyl-2-dimethylamino-1-(4-morpholinophenyl)-butanone, 2,2-(dimethylamino)-2-[(4-methylphenyl)methyl]-1-[4-(4-morpholinyl) phenyl]-1-butanone, 1,2-octanedione, 1-[4-(phenylthio) phenyl]-,2-(O-benzoyloxime), ethanone,1-[9-ethyl-6-(2-methylbenzoyl)-9 H-carbazole-3-yl]-,1-(O-acetyloxime), (2E)-2-(benzoyloxyimino)-1-[4-(phenylthio)phenyl]octane-1-one, di-N-(p-formylamino)diphenylmethane, di-N(p-acetylamino)diphenylmethane, di-N-(p-benzoamide)diphenylmethane, 4-formylaminotoluylene, 4-acetylaminotoluylene, 2,4-diformylaminotoluylene, 1-formylaminonaphthalene, 1-acetylaminonaphthalene, 1,5-diformylaminonaphthalene, 1-formylaminoanthracene, 1,4-diformylaminoanthracene, 1-acetylaminoanthracene, 1,4-diformylaminoanthraquinone, 1,5-diformylaminoanthraquinone, 3,3'-dimethyl-4,4'-diformylaminobiphenyl, 4,4'-diformylaminobenzophenone, bis{{(2-nitrobenzyl)oxy}carbonyl}diaminodiphenylmethane, 2,4-di{{(2-nitrobenzyl)oxy} toluylene, bis{{(2-nitrobenzyloxy)carbonyl}hexane-1,6-diamine, m-xylidine{{(2-nitro-4-chlorobenzyl)oxy}amide}, 9-anthrymethyl N,N-dimethylcarbamate, (E)-1-piperidino-3-(2-hydroxyphenyl)-2-propene-1-one, 1-(anthraquinone-2-yl)ethylimidazolecarboxylate, (2-nitrophenyl)methyl4-[(2-methylacryloxyl]piperidine-1-carboxylate, 1,2-diisopropyl-3-[bis(dimethylamino)methylene]guanidium 2-(3-benzoylphenyl)propionate or 1,2-dicyclohexyl-4,4,5,5-tetramethyl biguanidium n-butyltriphenylborate, etc.

In one or more embodiments, 2-octenyl succinic anhydride, sebacic dihydrazide and 1-methylimidazole are particularly preferable from the viewpoints of blending into a conductive paste composition, storage stability when the photobase generator is formulated into a one-part composition, curing activity or corrosion resistance against a conductive filler.

With regard to 100 parts by weight of the total of the binder (A), the epoxy monomer (B), the crosslinking agent (C) and the conductive filler (D), the crosslinking agent (C) may be contained in an amount of 1 part by weight or more and 20 parts by weight or less, preferably 1.5 parts by weight or more and 8 parts by weight or less, and more preferably 2 parts by weight or more and 7 parts by weight or less.

An amount of the crosslinking agent of less than 1 part by weight provides insufficient curability. On the other hand, an amount of the crosslinking agent exceeding 20 parts by weight leads to occurrence of warpage or lower storage stability.

<Conductive Filler (D)>

Examples of conductive particles contained in the conductive filler include silver powder, silver oxide powder, silver carbonate powder, silver acetate powder, a silver-coating powder, a silver-containing allow powder, nickel powder, copper powder or aluminum powder, etc. These may be used alone or in a mixture of two or more. In the case of silver powder, it may be preferable that the conductive particles comprise silver in a content of 70% by mass or more.

The firing temperature of the conductive filler may be preferably 200° C. or less, and more preferably 150° C. or less in consideration of application to film substrates for electric and electronic circuits. Note that in the case where the conductive particles are silver, even if the atmosphere is not made reductive, the conductivity is not lowered due to surface oxidation.

Also, the average particle size of conductive particles affects firing properties. Conductive particles having a large particle size are fired at a slower speed than conductive particles having a small particle size. Therefore, the average particle size may be preferably 0.1 μm or more and 15 μm or less. The reason for this is as follows: an average particle size less than 0.1 μm provides too fast firing speed, resulting in insufficient physical bonding strength; meanwhile, an average particle size exceeding 15 μm provides slightly slower firing speed, but this results in poor dispersibility in the conductive paste composition and poor printability, resulting in difficulty in fine printing.

The specific surface area of the conductive particles may be preferably 0.05 m$^2$/g or more and 5 m$^2$/g or less. A specific surface area of the conductive particles of less than 0.05 m$^2$/g does not allow a thin line to be drawn due to large particle size, whereas a specific surface area of the conductive particles exceeding 5 m$^2$/g worsens workability such that, for instance, a large amount of solvent is required for adjusting viscosity.

The shape of conducting particles may be a scaled, sphere, flake, irregular shape or a combination of these.

Further, with regard to 100 parts by weight of the total of the binder (A), the epoxy monomer (B), the crosslinking agent (C) and the conductive filler (D), the conductive filler (D) may be contained in an amount of 70 parts by weight or more and 95 parts by weight or less, preferably 80 parts by weight or more and 93 parts by weight or less, and more preferably 85 parts by weight or more and 91 parts by weight or less.

An amount of the conductive filler of less than 70 parts by weight, which is too small, increases electric specific resistance of electrodes obtained by firing. On the other hand, an amount of the conductive filler exceeding 95 parts by weight worsens printability of the conductive paste composition, resulting in insufficient adhesion strength to the object to be bonded.

<Dehydrating Agent (E)>

A dehydrating agent may be added to the conductive paste composition. In the preparation of the conductive paste composition, the dehydrating agent is added to the binder (A) before any one of the epoxy monomer (B), the crosslinking agent (C), and the conductive filler (D) is added to the binder (A). Alternatively, after the dehydrating agent (E) is added to the conductive filler (D), the binder (A), the epoxy monomer (B) and the crosslinking agent (C) are further added. Addition of a dehydrating agent as above converts moisture to another compound by a chemical reaction, so that storage stability of a conductive paste composition prepared as a one-part type increases. The dehydrating agent (E) may be used alone or in combination of two or more.

The dehydrating agent may be non-reactive or reactive. As the dehydrating agent, acid anhydrides exemplified as a crosslinking agent may be used. However, it may be preferable that the acid anhydride used as the dehydrating agent has a lower molecular weight than the acid anhydride used as the crosslinking agent. In one or more embodiments, the acid anhydride, which is a dehydrating agent, preferably has a low molecular weight even when the acid anhydride does not serve as a crosslinking agent.

When an electrode is formed from the conductive paste composition according to one or more embodiments of the present invention, the component which achieves low internal stress characteristics with respect to the substrate is the component (A), which is a reactive oligomer having a siloxane bond as a main skeleton and a plurality of oxirane rings as an organic group. It can be analyzed whether or not the component (A) is contained and in what content it is contained by the following method.

The content of the component (A) in a given range according to claim 1 in 100 parts by weight of the conductive paste composition enables the conductive paste composition to easily achieve low internal stress performance. The structure of the component (A) and the formulation amount of the component (A) in the conductive paste composition are analyzed by separating the component (D) from the conductive paste composition by a centrifugal separation method or the like, and then subjecting the liquid residue to a chromatographic analysis such as a gas chromatography mass spectrometry method, a pyrolysis gas chromatography mass spectrometry method, or a liquid chromatography mass spectrometry method. The analysis is carried out through analysis of the component (A), and qualitative analysis and quantitative analysis are possible.

Further, it is also possible to analyze presence or absence of the component (A) from a circuit after the conductive paste composition is printed as an electrode, followed by firing. Specifically, an X-ray photoelectron spectroscopy is used. More specifically, the XPS method (X-ray Photoelectron Spectroscopy) or the ESCA method (Electron Spectroscopy for Chemical Analysis) is used. As an analysis procedure, the surface of an electrode is irradiated with X-rays and reflected X-rays are detected to qualitatively analyze the structure of functional groups. Normally, general epoxy resins used in conductive pastes do not have a siloxane skeleton and can be easily distinguished. However, in the case of the cured product after firing, a quantitative analysis method such as that used for a liquid conductive paste composition before firing, is difficult to be used.

<Leveling Agent>

A leveling agent may be added to the conductive paste composition in order to adjust the surface roughness when cured. The leveling agent may be used alone or in combination of two or more.

The leveling agent is added in order to ensure smoothness of the coating film of the conductive paste composition and prevent breakage when the conductive paste composition is bonded to the object. The leveling agent may be fluorine-, silicone-, acrylic-, ether- or ester-based, and is not particularly limited.

<Diluent>

The conductive paste composition may further comprise a diluent other than the epoxy monomer (B). The diluent may be non-reactive or reactive. The diluent may be used alone or in combination of two or more.

There is no particular limitation on the non-reactive diluent, but it may be preferable that the diluent can be dried at 200° C. or lower. Examples of such non-reactive diluents include 2-phenoxyethanol, ethyl cellosolve, butyl cellosolve, cellosolve acetate, propylene glycol monomethyl ether acetate, butyl carbitol, diethylene glycol monobutyl ether, γ-butyl lactone, pyrrolidone, vinyl pyrrolidone, N-methyl-2-pyrrolidone, dimethylformamide or dimethylformamide, etc.

The reactive diluent is not particularly limited as long as it is a reactive low molecular weight compound. Examples of such reactive diluents include a silane coupling agent, a (meth)acrylic monomer, an isocyanate compound, a thiol compound, a vinyl ether or an oxetane compound, etc.

An oxetane compound may be more preferable from the viewpoint of reactivity at the time of curing and firing.

Examples of oxetane compounds include bifunctional oxetane compounds, such as bis(3-ethyl-3-oxetanylmethyl) ether, bis{[1-ethyl(3-oxetanyl)]methyl}ether, 1,4-bis[[(3-ethyl-3-oxetanyl)methoxy]methyl]benzene, 1,4-bis[(1-ethyl-3-oxetanyl)methoxy]benzene, 1,3-bis[(1-ethyl-3-oxetanyl)methoxy]benzene, 4,4'-bis[(3-ethyl-3-oxetanyl)methoxy]biphenyl, neopentyl glycol bis(3-ethyl-3-oxetanylmethyl)ether, polyethylene glycol bis(3-ethyl-3-oxetanylmethyl)ether or polypropylene glycol bis(3-ethyl-3-oxetanylmethyl)ether, etc.

<Adhesiveness Imparting Agent>

The conductive paste composition may comprise an adhesiveness imparting agent in order to improve adhesion to substrates. The adhesiveness imparting agent may be used alone or in combination of two or more.

The adhesiveness imparting agent may be preferably a crosslinking silyl group-containing compound and a polar group-having vinyl-based monomer, and furthermore, more preferably a silane coupling agent and an acid group-containing vinyl-based monomer from the viewpoint of improving adhesiveness to a substrate.

As the silane coupling agent, for example, a silane coupling agent which combines an organic group having an atom other than a carbon atom and a hydrogen atom, such as an epoxy group, an isocyanato group, an isocyanurate group, a carbamate group, an amino group, a mercapto group, a carboxyl group, a halogen group and a (meth) acryloyl group, etc., as well as a crosslinking silyl group in the molecule can be used.

<Filler>

The conductive paste composition may comprise a filler other than the conductive filler (D) in order to secure a given strength. The filler may be used alone or in combination of two or more.

The filler is not particularly limited as long as it is other than the conductive filler (D), but crystalline silica, fused silica, dolomite, carbon black, calcium carbonate, titanium oxide, or talc, etc. may be preferable. In particular, when it is desired to obtain a cured product having high strength using these fillers, at least one filler selected from the group consisting of crystalline silica, fused silica, anhydrous silicic acid, hydrous silicic acid, carbon black, surface treated fine calcium carbonate, calcined clay, clay and activated zinc oxide, etc. may be preferable.

<Thixotropicity Imparting Agent>

The conductive paste composition may comprise a thixotropicity imparting agent (sagging-preventing agent) to prevent sagging and improve workability.

Examples of the thixotropicity imparting agent include, but are not limited to, polyamide waxes; hydrogenated castor oil derivatives; and metal soaps such as calcium stearate, aluminum stearate and barium stearate, etc.

The thixotropicity imparting agent may be used alone or in combination of two or more. With regard to 100 parts by weight of the total of the binder (A), the epoxy monomer (B), the crosslinking agent (C) and the conductive filler (D), the thixotropicity imparting agent may be preferably contained in an amount of 0.1 parts by weight or more and 20 parts by weight or less. The thixotropicity imparting agent contained in an amount within the above-mentioned range enables one to secure a sufficient thixotropic property while maintaining the effects according to one or more embodiments of the present invention and to easily adjust thixotropicity depending upon the amount.

<Plasticizer>

The conductive paste composition may comprise a plasticizer in order to adjust viscosity, slump property, or mechanical properties when the conductive paste composition is cured, such as hardness, tensile strength or elongation. The plasticizer may be used alone or in combination of two or more.

Examples of Plasticizers Include phthalic acid ester compounds such as dibutyl phthalate, diisononyl phthalate (DINP), diheptyl phthalate, di(2-ethylhexyl) phthalate, diisodecyl phthalate (DIDP) and butyl benzyl phthalate, etc.;

terephthalic acid ester compounds such as bis(2-ethylhexyl)-1,4-benzenedicarboxylate (EASTMAN168 (manufactured by EASTMAN CHEMICAL), etc.;

non-phthalic acid ester compounds such as diisononyl 1,2-cyclohexanedicarboxylate (Hexamoll DINCH (manufactured by BASF);

aliphatic polyvalent carboxylic acid ester compounds such as dioctyl adipate, dioctyl sebacate, dibutyl sebacate, diisodecyl succinate, and tributyl acetyl citrate, etc.;

unsaturated fatty acid ester compounds such as butyl oleate and methyl acetylricinoleate;

phenyl alkylsulfonates (Mesamoll (manufactured by LANXESS));

phosphoric acid ester compounds such as tricresyl phosphate and tributyl phosphate;

trimellitic acid ester compounds;

chlorinated paraffins;

hydrocarbon-based oils such as alkyldiphenyl and partially hydrogenated terphenyl, etc.;

processing oils; and epoxy plasticizers such as epoxidized soybean oil and benzyl epoxy stearate, and the like.

[Method for Producing Conductive Paste Composition]

Conductive paste compositions are produced by kneading and dispersing raw materials, in a state where the binder (A), the epoxy monomer (B), the crosslinking agent (C) and the conductive filler (D), as well as other raw materials, if required, are contained. The method for kneading and dispersing is not particularly limited, and examples of the method include a kneading roll, a ball mill, a shaker or a method using a planetary stirring defoamer.

Note that when kneading, care should be taken to prevent a reactive binder from crosslinking due to heat production during kneading. The temperature during kneading may be preferably 0° C. or more and 80° C. or less, more preferably 5° C. or more and 60° C. or less, and even more preferably 10° C. or more and 50° C. or less, from the viewpoint of balance between stability and dispersion of the conductive filler by kneading.

[Characteristics of Conductive Paste Composition]

The conductive paste composition as described above serves as an electrode material for devices such as an FPD or a solar cell. Therefore, in the case of FPD, the conductive paste composition is used as a linear electrode on ITO (Indium Tin Oxide) film or as a circuit of FPC (Flexible Printed Circuits) made of polyimide. In the case of solar cell, the conductive paste composition may be used as a collector electrode on a silicon substrate. In particular, in a back-surface electrode type solar cell, electrodes are formed only on one main surface of the silicon substrate.

In application to such a device, an object (ITO film, silicon substrate, or the like) to which the conductive paste composition adheres is greatly affected by shrinkage due to firing of the conductive paste composition or internal stress caused by the electrode after being completed as an electrode. However, the above-mentioned conductive paste composition has low electrical resistivity and additionally has low shrinkage at the time of firing and low internal stresses after it is completed as electrodes (see the Examples and the Comparative Examples described below). Therefore, the above conductive paste composition is suitable as an electrode material for devices such as an FPD or a back-surface electrode type solar cell, having a curved surface design.

[Device Comprising Electrode Formed from Conductive Paste Composition]

The device according to one or more embodiments of the invention comprises an electrode formed from the conductive paste composition according to one or more embodiments of the invention. As described so far in this specification, examples of the device include an FPD and a solar cell, etc. Examples of the device also include an apparatus comprising an FPD. Specifically, a smart phone, a tablet, a flat-panel television and a car navigation system, etc. can be exemplified.

The present invention is not limited to the embodiments described above, and various modifications can be made within the scope of the claims. In other words, embodiments obtained by combining technical means appropriately changed within the scope shown in the claims are also included in the technical scope of the present invention.

EXAMPLES

Hereinafter, one or more embodiments of the present invention are disclosed in detail by referring to the Examples, but the present invention is not limited to these Examples.

<Binder>

The following materials were charged into a reactor equipped with a stirrer, a thermometer and a reflux condenser, and refluxed at a reaction temperature of 105° C. for 8 hours to obtain a condensate (binder).

2-(3,4-epoxycyclohexyl)ethyl trimethoxysilane (Silquest_A186; Momentive Performance Materials Japan Inc.): 100 parts by weight Magnesium chloride ($MgCl_2$; manufactured by Wako Pure Chemical Industries, Ltd.): 0.05 parts by weight Distilled water: 11.0 parts by weight Methanol (manufactured by Mitsubishi Gas Chemical Corporation): 11.0 parts by weight The resulting condensate was devolatilized and concentrated under reduced pressure using an evaporator, and a 70 wt. % solution was prepared using PGME (1-methoxy-2-propanol: manufactured by Daicel Corporation).

The obtained condensate had a weight average molecular weight of 3,200 by GPC, a residual epoxy ratio exceeding 0.9, a ratio Y/X of 0.2 or less, and a viscosity of 500 mPa·s (see the following formula). The weight average molecular weight, the residual epoxy ratio, the Y/X ratio, and the viscosity were measured by the following methods.

[Chem. 1]

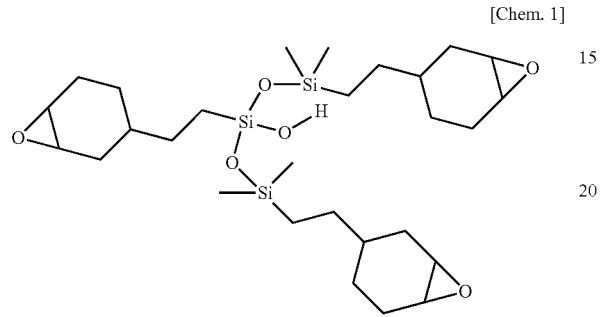

(Weight-Average Molecular Weight)
The weight average molecular weight was measured by GPC. That is, HLC-8220 GPC manufactured by Tosoh Corporation was used as a liquid feeding system, TSK-GEL H manufactured by Tosoh Corporation was used as a column, and THF was used as a solvent. The weight average molecular weight was calculated on a polystyrene-equivalent basis.
(Evaluation of Residual Epoxy Group (Residual Epoxy Ratio))
$^1$H-NMR measurement of the obtained condensate (binder) was performed using deuterated acetone as a solvent, with JNM-LA400 manufactured by JEOL Ltd. The result is shown as "residual epoxy ratio".
(Quantification of OR Groups Bonded Directly to Silicon (Y/X Ratio))
The OR groups directly bonded to silicon of the silane compound before and after the reaction were measured and the Y/X ratio was calculated. Using JNM-LA400 manufactured by JEOL Ltd., the concentrations of ORs were measured using deuterated acetone as a solvent in $^1$H-NMR and $^{29}$Si-NMR.
(Viscosity)
Viscosity is measured using a type B viscometer described in the JISZ 8803. In particular, since the conductive paste composition has a high viscosity, it was measured by an HB type (manufactured by Eko Instruments).
<Conductive Paste Composition (See Table 1)>
[Example 1]
The following raw materials were added to a container exclusively used for blending (φ89×φ98×94 mm, content 470 cc, made of polypropylene), lightly mixed with a scoopula, and then stirred and defoamed for 1 minute under the conditions of 2,000 rpm and vacuum degree of 30 Pa using a vacuum type stirring defoamer (ARV-310LED; manufactured by Thinky), to obtain a conductive paste formulation.
<Binder> the above-described binder: 2.70 g
<Epoxy monomer> diethylene glycol diglycidyl ether (Epolite 100E; manufactured by Kyoei Chemical Co., Ltd., see formula below): 7.80 g

[Chem. 2]

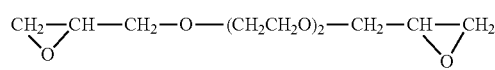

<Crosslinking agent> 2-octenyl succinic anhydride (manufactured by Tokyo Chemical Industry Co., Ltd., see formula on the left below): 3.80 g, and 1-methylimidazole (manufactured by Tokyo Chemical Industry Co., Ltd., see formula on the right below): 0.02 g

[Chem. 3]

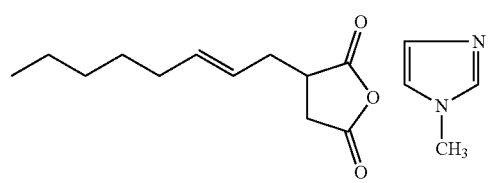

<Conductive filler> silver powder (AY-6080: manufactured by Tanaka Kikinzoku Kogyo K. K.): 136.50 g
[Example 2]
A conductive paste composition was prepared in the same manner as in Example 1, except that the diethylene glycol diglycidyl ether was replaced with polyethylene glycol diglycidyl ether (Epolite 200E; manufactured by Kyoei Chemical Co., Ltd., see the following formula).

[Chem. 4]

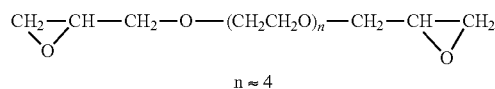

[Example 3]
A conductive paste composition was prepared in the same manner as in Example 1, except that diethylene glycol diglycidyl ether was changed to C12,13 mixed higher alcohol glycidyl ether (M-1230; manufactured by Kyoei Chemical Co., Ltd.; see the following formula) and 0.75 g of fluorine-based dispersant (LE607: manufactured by Kyoei Chemical Co., Ltd.) was added as a leveling agent.

[Chem. 5]

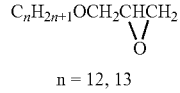

[Example 4]
A conductive paste composition was prepared in the same manner as in Example 3, except that silver powder was changed to silver-plated copper powder (TFM-CO2P (spherical filler, average particle size: 2 μm); manufactured by Toyo Aluminum Co., Ltd.).
[Example 5]
In Example 5, in addition to the raw materials used in Example 1, 0.1 g of acetic anhydride (manufactured by Tokyo Chemical Industry Co., Ltd., chemical formula: $CH_3—CO—O—CO—CH_3$) was used as a dehydrating agent to produce a conductive paste composition. Specifically, a binder and a dehydrating agent were added to the container exclusive for blending of Example 1, lightly mixed with a scoopula, and then the binder was sufficiently dehydrated by stirring and defoaming for 1 minute under conditions of 2,000 rpm and a vacuum degree of 30 Pa, using the above-mentioned vacuum type stirring defoamer of Example 1. Thereafter, an epoxy monomer, a crosslinking agent, and a conductive filler were further added to the container, mixed lightly with a scoopula, and then stirred and defoamed for 1 minute under the conditions of 2,000 rpm and 30 Pa vacuum, using the stirring defoamer to obtain a conductive paste formulation.

[Example 6]

A conductive paste composition was prepared in the same manner as in Example 3, except that sebacic dihydrazide was used instead of 1-methylimidazole as the crosslinking agent (see the formula below) and no leveling agent was used.

[Chem. 6]

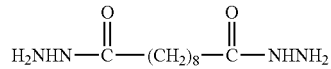

[Example 7]

A conductive paste composition was prepared in the same manner as in Example 5, except that a conductive filler and a dehydrating agent were added to the container instead of the binder and the dehydrating agent to sufficiently dehydrate the conductive filler instead of the binder, and a binder, an epoxy monomer and a crosslinking agent were further added instead of the epoxy monomer, the crosslinking agent and the conductive filler to the container.

[Comparative Example 1]

The following raw materials were added to a container, which is the same as that used in the Examples and which is exclusively used for blending. The raw materials were lightly mixed with a scoopula, and then stirred and defoamed for 1 minute under the conditions of 2,000 rpm and vacuum degree of 30 Pa, using a vacuum type stirring defoamer (ARV-310LED; manufactured by Thinky), to obtain a conductive paste composition.

<Binder> bisphenol A-based resin (Epicoat 828, manufactured by Mitsubishi Chemical Corporation, see the formula below): 5.00 g

[Chem. 7]

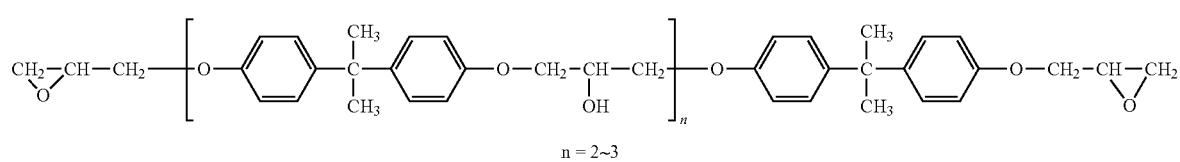

n = 2~3

<Epoxy monomer> limonene dioxide (LDO; manufactured by Tomoe Engineering Co., Ltd., see the formula below): 3.00 g

[Chem. 8]

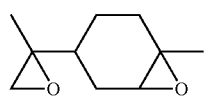

<Crosslinking agent> 1-methylimidazole (manufactured by Tokyo Chemical Co., Ltd.): 1.00 g <Conductive filler> silver powder (AY-6080: manufactured by Tanaka Kikinzoku Kogyo K. K.): 136.50 g,

[Comparative Example 2]

A conductive paste composition was produced in the same manner as in Comparative Example 1 using the following raw materials.

<Binder> the binder used in the Examples: 8.4 g

<Crosslinking agent> 3,4,5,6-tetrahydrophthalic anhydride (manufactured by Tokyo Chemical Industry Co., Ltd., see the formula below): 5.1 g, and 1-methylimidazole (manufactured by Tokyo Chemical Industry Co., Ltd.): 0.02 g

[Chem. 9]

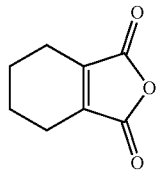

<Conductive filler> 136.50 g of silver powder (AY-6080: manufactured by Tanaka Kikinzoku Kogyo K. K.) 136.5 g, Diluent 2-phenoxyethanol (manufactured by Tokyo Chemical Industries, Ltd., see the formula below): 12.00 g

[Chem. 10]

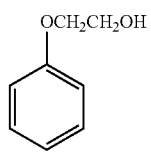

The following measurements and evaluations were performed on the selected Examples and Comparative Examples. The results are shown in Table 1 below.

(Resistance Measurement)

The conductive paste composition is printed on a glass plate (size: 10 mm×30 mm×2 mm thick) as a thin wire having a line width of 1 mm and a thickness of 55 μm, then dried at 130° C. for 30 minutes, and further fired at 180° C. for 60 minutes. The resistance with regard to 2 mm of this thin wire was measured. The measurement was carried out using a tester manufactured by Hioki E. E. Corporation under a condition of 23° C. with terminals applied to the thin wire.

(Measurement of Warpage of Aluminum Substrate after Coating, Drying, and Firing the Substrate)

The conductive paste composition is uniformly printed on an aluminum substrate having a thickness of 0.1 mm, a width of 25 mm and a length of 150 mm so as to have a thickness of 55 μm, a width of 20 mm and a length of 145 mm, dried at 130° C. for 30 minutes, and fired at 180° C. for 60 minutes. The warp state of the end portion of the aluminum substrate after firing was measured with reference to the horizontal.

(Evaluation of Presence or Absence of Defects in a Silicon Substrate after Printing, Drying and Firing the Silicon Substrate)

The conductive paste composition is printed as a collecting electrode pattern of line and space (line width 55 μm×length 153 mm, distance between thin wires 2.04 mm, thickness 12 μm) on a silicon substrate having a width of 6 inches and a thickness of 180 μm, using a printing plate having a line width of 40 μm and a thickness of 15 μm, dried at 130° C. for 30 minutes, and further fired at 180° C. for 60 minutes. Then, presence or absence of defects on the fired silicon substrate was evaluated.

(Measurement of Warpage of the Film after Printing, Drying, and Firing on ITO Film)

The conductive paste composition is printed on ITO film (lower layer: PET (thickness: 50 μm), upper layer: ITO (20 nm)) with a thickness of 20 μm and line/space of 100 μm/300 μm, and dried and fired at 150° C. for 60 minutes. The warp state of the end portion of the fired ITO film was measured with reference to the horizontal.

(Evaluation of Storage Stability)

The conductive paste composition was placed in a 100 cc plastic light-shielding bottle and stored at 50° C., and the fluidity of the paste was visually confirmed.

TABLE 1

| Raw material | Grade, substance name | Manufacturer | Example 1 [g] | Example 1 [Parts by weight] | Example 2 [g] | Example 2 [Parts by weight] | Example 3 [g] | Example 3 [Parts by weight] |
|---|---|---|---|---|---|---|---|---|
| Binder | Synthesis example resin solution (70% by weight) | Kaneka | 2.70 | 1.79 | 2.70 | 1.79 | 2.70 | 1.79 |
|  | Epicoat 828 | Mitsubishi Chemical | — | — | — | — | — | — |
| Epoxy monomer | Epolite 100E | Kyoei Chemical | 7.80 | 5.17 | — | — | — | — |
|  | Epolite 200E | Kyoei Chemical | — | — | 7.80 | 5.17 | — | — |
|  | Epolite M-1230 | Kyoei Chemical | — | — | — | — | 7.80 | 5.17 |
|  | LDO | Tomoe Engineering | — | — | — | — | — | — |
| Crosslinking agent | 2-octenyl succinic anhydride | Tokyo Chemical Industry | 3.80 | 2.52 | 3.80 | 2.52 | 3.80 | 2.52 |
|  | 1-methylimidazole | Tokyo Chemical Industry | 0.02 | 0.01 | 0.02 | 0.01 | 0.02 | 0.01 |
|  | Sebacic dihydrazide |  | — | — | — | — | — | — |
|  | 3,4,5,6-tetrahydrophthalic anhydride | Tokyo Chemical Industry | — | — | — | — | — | — |
| Conductive filler | AY-6080 (Silver powder) | Tanaka Kikinzoku | 136.50 | 90.51 | 136.50 | 90.51 | 136.50 | 90.51 |
|  | TFM-CO2P (Silver-plated copper powder) | Toyo Aluminium | — | — | — | — | — | — |
| Dehydrating agent | Acetic anhydride | Tokyo Chemical Industry | — | — | — | — | — | — |
| Leveling agent | LE607 | Kyoei Chemical | — | — | — | — | 0.75 | 0.19 |
| Diluent | 2-phenoxyethanol | Tokyo Chemical Industry | — | — | — | — | — | — |
| Resistivity value |  |  | 0.28 [Ω] |  | 0.28 [Ω] |  | 0.26 [Ω] |  |
| Warpage of aluminum substrate |  |  | 0 [mm] |  | 0 [mm] |  | 0 [mm] |  |
| Defect in silicon substrate |  |  | No defects |  | — |  | Not measured |  |
| Warpage of ITO film |  |  | — |  | — |  | 2 [mm] |  |
| Storage stability | Storage temperature × time → result (○/X) |  | 50° C. × 1 week → ○ |  | — |  | — |  |

| Raw material | Grade, substance name | Manufacturer | Example 4 [g] | Example 4 [Parts by weight] | Example 5 [g] | Example 5 [Parts by weight] | Example 6 [g] | Example 6 [Parts by weight] |
|---|---|---|---|---|---|---|---|---|
| Binder | Synthesis example resin solution (70% by weight) | Kaneka | 2.70 | 1.79 | 2.70 | 1.79 | 2.70 | 1.79 |
|  | Epicoat 828 | Mitsubishi Chemical | — | — | — | — | — | — |
| Epoxy monomer | Epolite 100E | Kyoei Chemical | — | — | 7.80 | 5.17 | — | — |
|  | Epolite 200E | Kyoei Chemical | — | — | — | — | — | — |
|  | Epolite M-1230 | Kyoei Chemical | 7.80 | 5.17 | — | — | 7.80 | 5.17 |
|  | LDO | Tomoe Engineering | — | — | — | — | — | — |
| Crosslinking agent | 2-octenyl succinic anhydride | Tokyo Chemical Industry | 3.80 | 2.52 | 3.80 | 2.52 | 3.80 | 2.52 |
|  | 1-methylimidazole | Tokyo Chemical Industry | 0.02 | 0.01 | 0.02 | 0.01 | — | — |
|  | Sebacic dihydrazide |  | — | — | — | — | 0.02 | 0.01 |
|  | 3,4,5,6-tetrahydrophthalic anhydride | Tokyo Chemical Industry | — | — | — | — | — | — |

TABLE 1-continued

| Raw material | Grade, substance name | Manufacturer | [g] | [Parts by weight] | [g] | [Parts by weight] | [g] | [Parts by weight] |
|---|---|---|---|---|---|---|---|---|
| Conductive filler | AY-6080 (Silver powder) | Tanaka Kikinzoku | — | — | 136.50 | 90.51 | 136.50 | 90.51 |
| | TFM-CO2P (Silver-plated copper powder) | Toyo Aluminium | 136.50 | 90.51 | — | — | — | — |
| Dehydrating agent | Acetic anhydride | Tokyo Chemical Industry | — | — | 0.10 | 0.07 | — | — |
| Leveling agent | LE607 | Kyoei Chemical | 0.75 | 0.49 | — | — | — | — |
| Diluent | 2-phenoxyethanol | Tokyo Chemical Industry | — | — | — | — | — | — |
| | Resistivity value | | 0.27 [Ω] | | 0.26 [Ω] | | 0.33 Ω | |
| | Warpage of aluminum substrate | | 0 [mm] | | 0 [mm] | | 0 [mm] | |
| | Defect in silicon substrate | | — | | — | | — | |
| | Warpage of ITO film | | — | | — | | — | |
| Storage stability | Storage temperature × time → result (○/X) | | — | | 50° C. × 2 weeks → ○ | | — | |

| | | | Example 7 | | Comparative Example 1 | | Comparative Example 2 | |
|---|---|---|---|---|---|---|---|---|
| Raw material | Grade, substance name | Manufacturer | [g] | [Parts by weight] | [g] | [Parts by weight] | [g] | [Parts by weight] |
| Binder | Synthesis example resin solution (70% by weight) | Kaneka | 2.70 | 1.79 | — | — | 8.40 | 5.59 |
| | Epicoat 828 | Mitsubishi Chemical | — | — | 5.00 | 3.44 | — | — |
| Epoxy monomer | Epolite 100E | Kyoei Chemical | 7.80 | 5.17 | — | — | — | — |
| | Epolite 200E | Kyoei Chemical | — | — | — | — | — | — |
| | Epolite M-1230 | Kyoei Chemical | — | — | — | — | — | — |
| | LDO | Tomoe Engineering | — | — | 3.00 | 2.06 | — | — |
| Crosslinking agent | 2-octenyl succinic anhydride | Tokyo Chemical Industry | 3.80 | 2.52 | — | — | — | — |
| | 1-methylimidazole | Tokyo Chemical Industry | 0.02 | 0.01 | 1.00 | 0.69 | 0.02 | 0.01 |
| | Sebacic dihydrazide | | — | — | — | — | — | — |
| | 3,4,5,6-tetrahydrophthalic anhydride | Tokyo Chemical Industry | — | — | — | — | 5.10 | 3.40 |
| Conductive filler | AY-6080 (Silver powder) | Tanaka Kikinzoku | 136.50 | 90.51 | 136.50 | 93.81 | 136.50 | 91.00 |
| | TFM-CO2P (Silver-plated copper powder) | Toyo Aluminium | — | — | — | — | — | — |
| Dehydrating agent | Acetic anhydride | Tokyo Chemical Industry | 0.10 | 0.07 | — | — | — | — |
| Leveling agent | LE607 | Kyoei Chemical | — | — | — | — | — | — |
| Diluent | 2-phenoxyethanol | Tokyo Chemical Industry | — | — | — | — | 12.00 | 8.00 |
| | Resistivity value | | 0.09 | | 0.33 [Ω] | | 0.28 [Ω] | |
| | Warpage of aluminum substrate | | 0 [mm] | | 5 [mm] | | 2 [mm] | |
| | Defect in silicon substrate | | — | | Defects observed | | Defects observed | |
| | Warpage of ITO film | | — | | 15 [mm] | | — | |
| Storage stability | Storage temperature × time → result (○/X) | | — | | 50° C. × 1 day → X | | — | |

[Results]

Examples 1 to 7, which contained a reactive oligomer having a plurality of oxirane rings as an organic group as a binder, exhibited excellent results in terms of resistivity and warpage of the aluminum substrate compared with Comparative Example 1 containing a binder different from the reactive oligomer. Further, Examples 1 to 7 exhibited excellent results at least with respect to warpage of the aluminum substrate compared to Comparative Example 2 which does not contain an epoxy monomer.

It was found from comparison between Comparative Examples 1 and 2, in which the aluminum substrate warped, and Example 1, in which the aluminum substrate did not warp, that the electrodes made of the conductive paste composition caused shrinkage enough to warp the aluminum substrate, thereby giving a defect to the silicon substrate.

It was also found that in electrodes made of the conductive paste composition formed on ITO film that is more flexible than the aluminum substrate, warpage due to shrinkage of the conductive paste composition more easily appears in a greater extent (see Example 3 and Comparative Example 1).

In addition, Examples 1 and 5, which contained a reactive oligomer having a plurality of oxirane rings as an organic group as a binder, exhibited superior results in terms of storage stability compared to Comparative Example 1 containing a binder differing from the reactive oligomer. In the preparation of conductive paste compositions, Example 5, in which the system (more specifically a binder) was dehydrated using an acid anhydride with a low molecular weight prior to adding the crosslinking agent, gave more excellent storage stability than Example 1.

In the case where the dehydrating agent was added, the resistivity of the thin wire of Example 7, in which the dehydrating agent was added directly to the silver powder to dehydrate in advance and then the conductive paste composition was produced, was further lower than the resistivity of the thin wire of Example 5, in which the dehydrating agent was added to the binder to dehydrate in advance. This suggests that the pre-dehydration of the conductive filler improves reaction efficiency of the crosslinking agent in the system, resulting in lower resistivity.

Further, it was found that although in Comparative Example 1 in which a bisphenol A-based epoxy resin was used as a binder and an alicyclic epoxy resin was used as an epoxy monomer, the resistivity was relatively high, the resistivity was suppressed in the conductive paste composition containing the binder and the epoxy monomer of the Examples.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A conductive paste composition comprising:
   1 to 10 parts by weight of a binder (A);
   2 to 20 parts by weight of an epoxy monomer (B);
   1 to 20 parts by weight of a crosslinking agent (C); and
   70 to 95 parts by weight of a conductive filler (D),
   wherein the binder (A) is a homo-condensate of a compound represented by a general formula (I), or a condensate of the compound represented by the general formula (I) and a compound represented by a general formula (II), with the condensate including a reactive oligomer having a siloxane bond as a main skeleton and comprising a plurality of oxirane rings as an organic group,
   wherein the general formula (I) is defined by $R^1$—$(SiR^2_a(OR^3)_{3-a})$ wherein $R^1$ is an alkyl group having 1 to 10 carbon atoms, the terminal of which is substituted with an epoxycyclohexyl group, each $R^2$ is independently a hydrogen atom or a monovalent hydrocarbon group selected from an alkyl group having 1 to 10 carbon atoms, an aryl group having 6 to 25 carbon atoms, and an aralkyl group having 7 to 12 carbon atoms, each $R^3$ is independently a hydrogen atom or an alkyl group having 1 to 10 carbon atoms, and a is an integer of 0 to 2;
   wherein the general formula (II) is defined by $R^4$—$(SiR^2_a(OR^3)_{3-a})$, wherein $R^4$ is selected from a substituted or unsubstituted alkyl group having 1 to 10 carbon atoms, an alkenyl group and a substituted aryl group, and does not have an epoxy-structure-containing group, and $R^2$, $R^3$, and a are as defined above;
   wherein the epoxy monomer (B) comprises an oxirane ring, and
   wherein the total amount of the binder (A), the epoxy monomer (B), the crosslinking agent (C), and the conductive filler (D) is 100 parts by weight.

2. The conductive paste composition according to claim 1, wherein the epoxy monomer (B) comprises at least one selected from the group consisting of a bifunctional monomer having a glycol structure and a monofunctional monomer having an aliphatic structure.

3. The conductive paste composition according to claim 1, wherein the crosslinking agent (C) is a compound having a heat latent property.

4. The conductive paste composition according to claim 1, wherein the crosslinking agent (C) contains at least one selected from the group consisting of an imidazole compound, a hydrazine compound, and an acid anhydride.

5. The conductive paste composition according to claim 1, further comprising a dehydrating agent (E).

6. The conductive paste composition according to claim 5, wherein the dehydrating agent (E) is an acid anhydride.

7. A device comprising an electrode formed from the conductive paste composition according to claim 1.

8. A method for producing a conductive paste composition, comprising:
   adding a dehydrating agent (E) to a binder (A) before adding any one of an epoxy monomer (B), a crosslinking agent (C), and a conductive filler (D) to the binder (A); or
   adding the dehydrating agent (E) to the conductive filler (D), and then further adding the binder (A), the epoxy monomer (B), and the crosslinking agent (C) to a mixture of the dehydrating agent (E) and the binder (A),
   wherein the conductive paste composition comprises:
   1 to 10 parts by weight of the binder (A);
   2 to 20 parts by weight of the epoxy monomer (B);
   1 to 20 parts by weight of the crosslinking agent (C); and
   70 to 95 parts by weight of the conductive filler (D),
   wherein the binder (A) is a reactive oligomer having a siloxane bond as a main skeleton and comprising a plurality of oxirane rings as an organic group,
   wherein the epoxy monomer (B) comprises an oxirane ring, and
   wherein the total amount of the binder (A), the epoxy monomer (B), the crosslinking agent (C), and the conductive filler (D) is 100 parts by weight.

* * * * *